US008310828B2

(12) United States Patent
Collins

(10) Patent No.: US 8,310,828 B2
(45) Date of Patent: Nov. 13, 2012

(54) STORAGE ENCLOSURE AND METHODS

(75) Inventor: Graham Collins, Louvigne-du-Desert (FR)

(73) Assignee: Xyratex Technology Limited, Havant (GB)

( * ) Notice: Subject to any disclaimer, the term of this patent is extended or adjusted under 35 U.S.C. 154(b) by 248 days.

(21) Appl. No.: 12/843,725

(22) Filed: Jul. 26, 2010

(65) Prior Publication Data
US 2012/0020005 A1    Jan. 26, 2012

(51) Int. Cl.
    G06F 1/16    (2006.01)
(52) U.S. Cl. ............. 361/679.37; 361/679.33; 29/603.03
(58) Field of Classification Search ............. 361/679.37;
    53/467; 29/603.03
    See application file for complete search history.

(56) References Cited

U.S. PATENT DOCUMENTS

| | | | | |
|---|---|---|---|---|
| 5,278,730 A * | 1/1994 | Kikinis | ..................... | 361/679.32 |
| 6,392,892 B1 * | 5/2002 | Sobolewski et al. | .......... | 361/724 |
| 7,126,817 B2 * | 10/2006 | Li | ............................ | 361/679.37 |
| 7,193,856 B2 * | 3/2007 | Hidaka | ......................... | 361/725 |
| 7,283,371 B1 * | 10/2007 | Grouell et al. | ................ | 361/741 |
| 7,304,855 B1 * | 12/2007 | Milligan et al. | .............. | 361/724 |
| 7,583,507 B2 * | 9/2009 | Starr et al. | ..................... | 361/727 |
| 2007/0230111 A1 * | 10/2007 | Starr et al. | ..................... | 361/685 |
| 2010/0118484 A1 * | 5/2010 | Sasagawa et al. | ......... | 361/679.37 |
| 2011/0222234 A1 * | 9/2011 | Davis et al. | ............. | 361/679.33 |
| 2012/0020007 A1 * | 1/2012 | Collins | .................... | 361/679.39 |

OTHER PUBLICATIONS

Davis et al., U.S. Appl. No. 12/722,012, filed Mar. 11, 2010.

* cited by examiner

Primary Examiner — Lisa Lea Edmonds
(74) Attorney, Agent, or Firm — Pillsbury Winthrop Shaw Pittman LLP

(57) ABSTRACT

There is disclosed a storage enclosure (10) and method of manufacturing a storage enclosure (10) comprising a plurality of bays (22) for receiving disk drives (100), the storage enclosure comprising: a chassis (24); a plurality of guide members (28), each bay having a first guide member at one end of the bay and a second guide member at the opposed end of the bay, the guide members (28) being constructed and arranged to engage with and guide a disk drive (100) into the bay (22) and to hold the disk drive (100) in a received position in the bay (22); and, a plurality of resilient mounts (97) by which each guide member (28) is attached to the chassis (24), wherein the mount (97) is arranged to isolate the disk drive from the chassis to reduce vibration being transmitted between the disk drive and the chassis.

12 Claims, 10 Drawing Sheets

STORAGE ENCLOSURE AND METHODS

The present invention relates in aspects to storage enclosures, to a method of receiving a disk drive in one of a plurality of bays in a storage enclosure, and to a method of manufacturing a storage enclosure having a plurality of bay for receiving disk drives.

In preferred embodiments, the present invention relates to carriers for containing disk drives in storage enclosures, such as "redundant array of inexpensive disks" (RAID) arrays, "just a bunch of disks" (JBOD) functionality or "switched bunch of disks" (SBOD) functionality or "expander-based bunch of disks" (EBOD) functionality based on "SAS expander" technology, "storage array network" (SAN) or "network attached storage" (NAS) storage, server enclosures and other mass storage devices.

The use of storage enclosures for containing disk drive units is well known in the art per se. Such enclosures are usually modular, having disk drive bays at the front of the enclosure for receiving disk drive units mounted in carriers, and bays at the rear of the enclosure for receiving various other modules, such as power supply units (PSUs), cooling modules and various electronics modules. These electronics modules typically include one or more controllers for the disk drive assemblies, providing input/output connections to the enclosure and implementing the desired functionality of the disk drives, e.g. as "just a bunch of disks" (JBOD) or an RAID array, etc. The electronics modules may also provide enclosure management services or other functionality. The various modules connect into a midplane within the enclosure. The modules are removable from the enclosure for maintenance and/or replacement. Often modules at the rear of the enclosure are provided in duplicate or more so that a certain measure of redundancy can be provided in case of failure of a module. Many different layouts and configurations of data storage enclosures are possible and, indeed, available commercially.

One important consideration in the manufacture of storage enclosures and carriers for storage enclosures is the layout and positioning of the disk drive units within the enclosure and the way they are mounted. It is desirable to make best use of the available space in the storage enclosure to fit in as many disk drive units as possible to increase the amount of storage the enclosure can provide. However, there are various considerations balanced against this desire to fit in as many disk drives as possible. For example, the structure of the carrier and enclosure should preferably allow the disk drive units to be easily removed from and inserted to the enclosure, possibly by "hot-swapping" the disk drives so that that the enclosure need not taken out of use while the disk drive unit is swapped. The structure must also be strong and robust enough to support the disk drive units. It is also necessary to ensure that adequate cooling is provided to the disk drive units to prevent overheating. This is usually implemented by providing a cooling airflow through the enclosure which cools the disk drive units and/or other components of the enclosure. The support structure should also therefore allow adequate airflow between the disk drive units.

A further consideration is that disk drives generate vibration when in use. The trend in disk drive manufacture is for increased spindle speeds and increased areal densities of data on the disk, e.g. higher numbers of tracks per inch. This tends to make disk drives more sensitive to mechanical vibration. It is desired for the mounting system to manage the vibration that may be generated by potentially a large number of disk drives operating simultaneously in a confined space.

In the prior art, a typical arrangement is to have a lattice of cells at the front of the enclosure into which disk drives can be inserted by the user in carriers. Drives are slotted into the lattice through the front of the enclosure. The drives are typically "hard mounted" via a carrier to the enclosure and thus to the rack to which the enclosure is mounted. This provides a transmission path for external vibrations, for example generated by power supply fans, cooling fans, other disk drives, etc., to be transmitted to the disk drives in the enclosure and thus negatively affect the performance of the drives. This problem is exacerbated by the desire to fit as many drives as possible into a given volume.

Other solutions for controlling vibration proposed by the prior art involve attaching large masses to the disk drives to reduce vibration of the disk drives. However, this solution creates other challenges as it leads to a very heavy enclosure and problems in supporting the increased weight. Thus, this solution is not desirable for some applications.

According to a first aspect of the present invention, there is provided a storage enclosure comprising a plurality of bays for receiving disk drives, the storage enclosure comprising:
a chassis;
a plurality of guide members, each bay having a first guide member at one end of the bay and a second guide member at the opposed end of the bay, the guide members being constructed and arranged to engage with and guide a disk drive into the bay and to hold the disk drive in a received position in the bay; and,
a plurality of resilient mounts by which each guide member is attached to the chassis, wherein the mount is arranged to isolate the disk drive from the chassis to reduce vibration being transmitted between the disk drive and the chassis.

It should be noted that references to a disk drive being received in the bay should be interpreted as including the case where a disk drive is mounted in a carrier or other intermediary structure which is in turn received in the bay.

This invention describes a way of individually isolating drives from their surrounding structure thus reducing external vibrations entering the disk drive and affecting its performance. The combination of a damping mount and rigid location array ensures spatial location within the chassis array whilst providing a "soft" mount.

The present invention is particularly advantageous when used in conjunction with a storage enclosure as disclosed in the co-owned application U.S. patent application Ser. No. 12/722,012, filed 11 Mar. 2010, entitled "Storage Enclosure, Carrier and Methods", the entire contents of which are incorporated herein by reference. This storage enclosure provides a rigid structural framework for supporting disk drives in carriers in drawers, where the weight of the disk drives is transferred to the sides of the drawers and then, via runners, to the sides of the enclosure and then to the rack or cabinet in which the enclosure is mounted. This enables the enclosure to achieve a particularly high density of disk drives within the volume of the enclosure. The resultant structure to support the weight of the disk drives is stiff.

This however allows efficient transmission of vibration through the structure. This, coupled with the close proximity of neighbouring disk drives, could result in diminished performance of the disk drives due to vibration affecting the disk drives. In this preferred embodiment, the soft mounting of the guide members via the mounts within the stiff chassis prevents or significantly reduces external vibration reaching the disk drives, whilst maintaining a positive location for the guide members. The preferred embodiment "floats" the guide member or members in the drawer on mounts in such a way that each axis (in the x, y & z directions and any combination thereof) is isolated from the rigid chassis and drawer structure whilst still maintaining dimensional accuracy within the disk drive array.

The arrangement can also be made light in weight. For example, the chassis can be made from thin sheet metal members, the guide members can be made from plastics and the mounts can be made from elastomer or other suitable materials.

In a preferred embodiment, the enclosure has drawers in which the bays are arranged to receive a disk drive with a downward plugging direction. In a preferred embodiment, the disk drive is held in the bay with an orientation in which it is on its side, with the guide members engaging with the ends of the disk drive (i.e. for standard disk drive, the end of the drive with a connector and its opposed end).

In a preferred embodiment, the guide member has a plurality of projections and each mount has a hole therethrough, wherein the projections are received in the holes of the mounts in order to attach the guide member to the chassis. This provides a preferred way of attaching/detaching the guide members to the chassis that is simple to manufacture and assemble. The guide member can be "press fit" to the chassis via the mount. Thus, tools are not required. Also the arrangement does not require much space in the enclosure. The mounts may be attached for example to a sheet member of the chassis, i.e. a member having a very thin width, meaning that the elements required to attach the positioning members to the chassis can take up relatively little room in the enclosure. The sheet member provides stiffness to support the weight of the disk drives, whilst taking up relatively little room, whereas the resilient mounts isolate the disk drives from vibration being transmitted by the structure.

In a preferred embodiment, the projection has a head portion that is larger than the hole in the mount, the mount being compliant to allow the head portion to pass through the hole to secure the guide member in place. This helps secure the guide member is place and prevent the members becoming detached when the bay is unpopulated by a disk drive/carrier.

In a preferred embodiment, the mounts comprise bushes attached to holes in the chassis.

In another embodiment, the mounts comprise a sheet of resilient material attached to the chassis, the chassis having holes corresponding to the holes in the mounts.

In a preferred embodiment, the chassis comprises at least one sheet member, wherein the sheet member has guide members attached to both of its sides for corresponding bays on either side of the sheet member. This helps keep the size of the mounting arrangement small, whilst providing a stiff chassis for supporting the weight of the disk drives. This helps keep the size of the mounting arrangement small.

In a preferred embodiment, the guide members have holes or depressions therein for receiving the head portions of the projections of the corresponding guide members on the other side of the sheet member. This allows the guide members to be mounted closer to the sheet member and for the sheet member to be thinner without the heads of the projections interfering with the guide members on the other side of the sheet member. This helps minimise the space taken up by the mounting arrangement.

In a preferred embodiment, the projections of each guide member are staggered relative to each other. By appropriate positioning of the mounts, this can help reducing different modes of vibration being transferred to the disk drive.

In a preferred embodiment, at least one guide member comprises a resiliently biased lift element arranged to lift the disk drive at least partially out of the bay.

In preferred embodiments a latch mechanism is used either on the carrier or in the bay to secure the disk drive/carrier in the received position against the bias of the lift elements. This arrangement of the lift elements helps hold the disk drive securely in place in the bay. This arrangement also makes removal of the disk drive from the bay more simple, e.g. by releasing the latch, so the disk drive/carrier rises partway out of the bay due to the lift elements to a position where the disk drive extends above the other disk drives, so that the operator can easily grasp sides of the disk drive/carrier to remove it.

According to a second aspect of the present invention, there is provided in combination, a storage enclosure according as described above and a disk drive held in a carrier, wherein the carrier is received in the bay and held in position by a guide member at each end of the bay.

Preferably the guide members and the carrier have shaping that cooperates to guide the carrier into the bay and helps hold the carrier in the received position in the bay. Preferably the shaping at the two ends of the carrier is keyed to the shaping of the guide members to help prevent incorrect insertion of the carrier/disk drive in the bay.

According to a third aspect of the present invention, there is provided a method of receiving a disk drive in one of a plurality of bays in a storage enclosure, the method comprising:

advancing the disk drive into the bay; and, guiding the disk drive into a received position in the bay with a guide member at each end of the bay, wherein the storage enclosure has a chassis and each guide member is attached to the chassis by a plurality of resilient mounts arranged to isolate the disk drive from the chassis to reduce vibration being transmitted between them.

According to a forth aspect of the present invention, there is provided a method of manufacturing a storage enclosure having a plurality of bay for receiving disk drives, the enclosure having a chassis and a plurality of guide members, the bays having a guide member at each end for guiding a disk drive into a received position in the bays, the method comprising:

attaching a plurality of resilient mounts to the chassis; and, attaching the guide members to the chassis by pushing a plurality of protrusions of each guide member through corresponding holes in the mounts.

Preferably, the mount is overmoulded to a hole or other aperture in the chassis. The mount may be attached to a sheet metal member of the chassis. The protrusion may be an interference fit or snap fit to the hole in the mount.

Embodiments of the present invention will now be described by way of example with reference to the accompanying drawings, in which.

Figure 1:
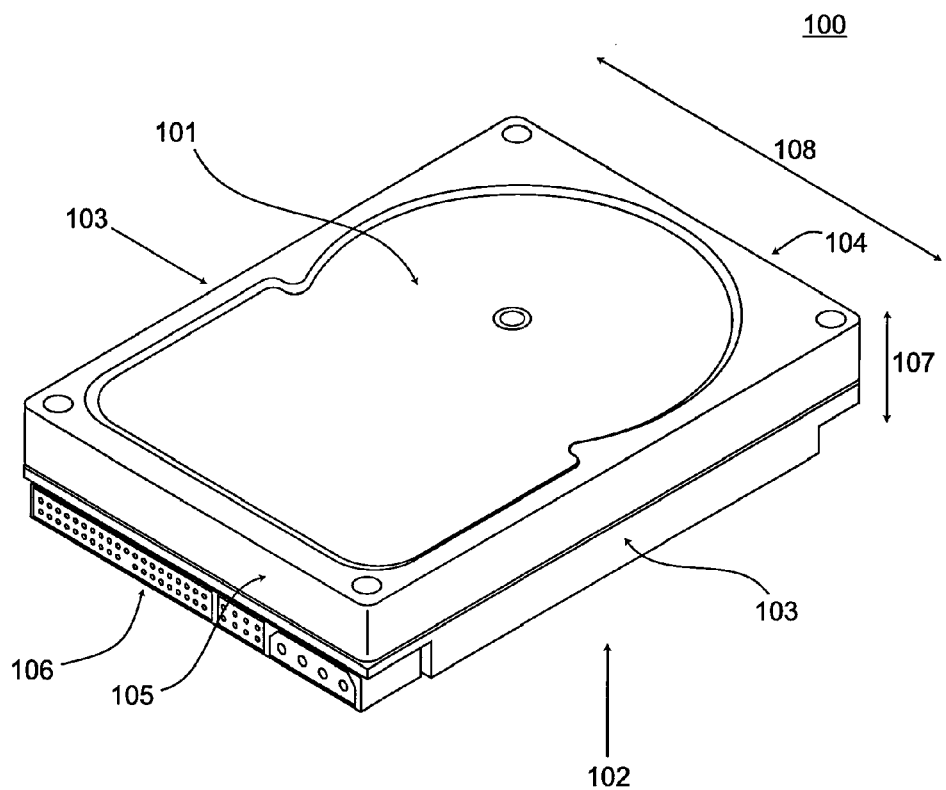
FIG. 1 shows a disk drive unit.

FIG. 1 shows an example of a 3.5 inch (88.9 mm) disk drive unit 100. The disk drive unit 100 has a top face 101, a bottom face 102, side faces 103, a front end 104 and a rear end 105. The rear end 105 holds a rearward facing connector or connectors 106 for making power and data connection to the disk drive unit 100, e.g. a SATA connector. The height 107 of the disk drive unit 100 is 26.1 mm. The width 108 of the disk drive unit 100 is 101.6 mm. These dimensions are specified in the industry standard specification (SFF-8301).

Figure 2:
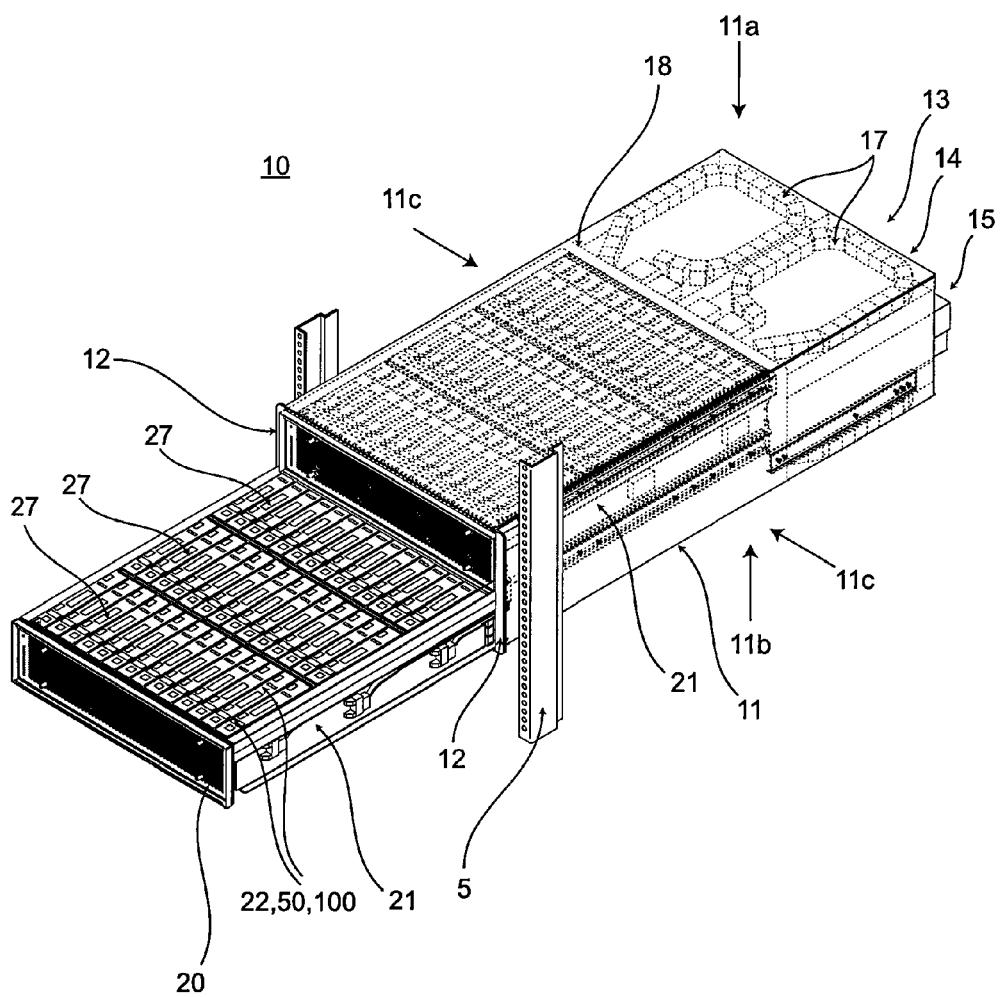
FIG. 2 shows a perspective view from the front, side and top of an example of a storage enclosure suited for use with embodiments of the present invention.

FIG. 2 shows an example of a storage enclosure 10 as disclosed in the co-owned application U.S. patent application Ser. No. 12/722,012, filed 11 Mar. 2010, entitled "Storage Enclosure, Carrier and Methods", the entire contents of which are incorporated herein by reference. This enclosure 10 has a novel and advantageous layout of and manner of supporting disk drives in the enclosure. The present invention in preferred embodiments is suitable for use with this storage enclosure 10. However, in principle, the present invention can be used with storage enclosures having other suitable layouts, and arrangements and orientations of disk drives.

As is conventional, references to "sides", "above", "below", "downward" etc, in relation to the enclosure and/or its bays are given with reference to the orientation of a conventionally mounted enclosure, i.e. one mounted laterally in a 19 inch (approx. 482.6 mm) rack. References to "above" and "side" in relation to the enclosure should be interpreted consistently with this. Nonetheless, these terms should also be construed accordingly to cover a situation where the enclosure is arranged so as to be turned on its side to be vertically arranged, or indeed in any orientation.

Briefly, the enclosure 10 comprises a housing 11 having a top face 11A, bottom face 11B, and side faces 11C. The housing also has flanges 12 for fastening the storage enclosure 10 to a rack 5. The storage enclosure 10 has a 5U height (approx. 222.2 mm), a width sized to fit in a standard 19 inch rack (approx 48 cm) and a depth of approximately 1 m.

The front part of the storage enclosure 10 contains two drawers 20. Runners 21 positioned either side of the drawers 20 allow the drawers 20 to be moved forward and backward between a received position in the enclosure 10 (as shown by the topmost drawer 20) and a withdrawn position (as shown by the lowermost drawer 20). Each drawer 20 contains a plurality of bays 22 which are populated by disk drives 100 in carriers 50. Each drawer 20 has a single layer of bays 22 arranged in three rows of fourteen disk drives extending across the width of the drawer 20.

The rear of the enclosure 10 contains a plurality of cooling modules 13 arranged to draw cooling air through the enclosure 10 from front to rear; a plurality of power supply modules 14, for providing power to the enclosure; cables 17 for making data and power connection with the disk drives in the drawers; and a plurality of electronics modules 15, by which external connection may be made to the storage enclosure 10 and which provide the desired organisation of the disk drives 100 to the storage enclosure 10. For example, the electronics modules 15 may arrange the disk drive units 100 as a RAID array, or a JBOD (Just a Bunch Of Disks), or SBOD (Switched Bunch Of Disks), etc. A midplane 18 is disposed between the front and rear of the enclosure 10 to distribute data and power signals between the various components of the enclosure 10. The various ways of arranging modules at the rear of a storage enclosure are known in the art per se and are not described in detail herein.

Figure 3:
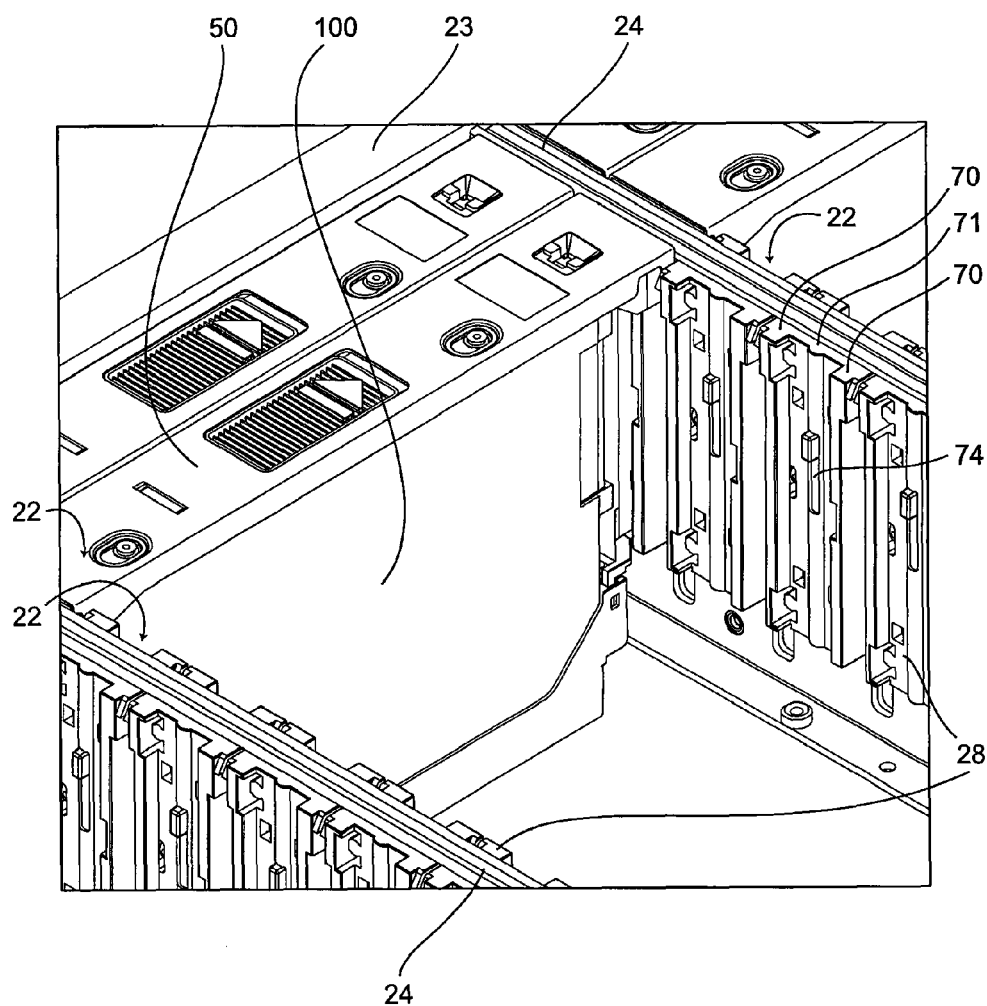
FIG. 3 shows a detail view of the drawer of FIG. 2.

FIG. 3 shows a detailed view of a drawer 20 with some bays 22 populated with disk drives 100 in carriers 50 and some bays 22 empty. The structural framework of the drawer 20 consists of side members 23 and cross members 24 running between the side members 23 so as to define three general spaces 27 (shown in FIG. 2) within the drawer 20 corresponding respectively to the three rows of disk drives 100. The cross members 24 have apertures 26, which allow cooling air to be drawn through the enclosure 10 to cool the disk drive units. Guide members 28 are attached to the cross members 24, and have shaping arranged help guide the disk drive carriers 50 into the bays 22 (described in more detail below). The guide members 28 may be manufactured for example from moulded plastics and attached to the cross members 24. Each bay 22 also has an upward facing connector (omitted from the drawings for clarity) for connecting to a disk drive inserted into that bay 22 and the drawer 20 has further circuitry and cables (omitted from the drawings for clarity) for distributing the signal between the disk drives 100 and the midplane 18.

Figure 4:
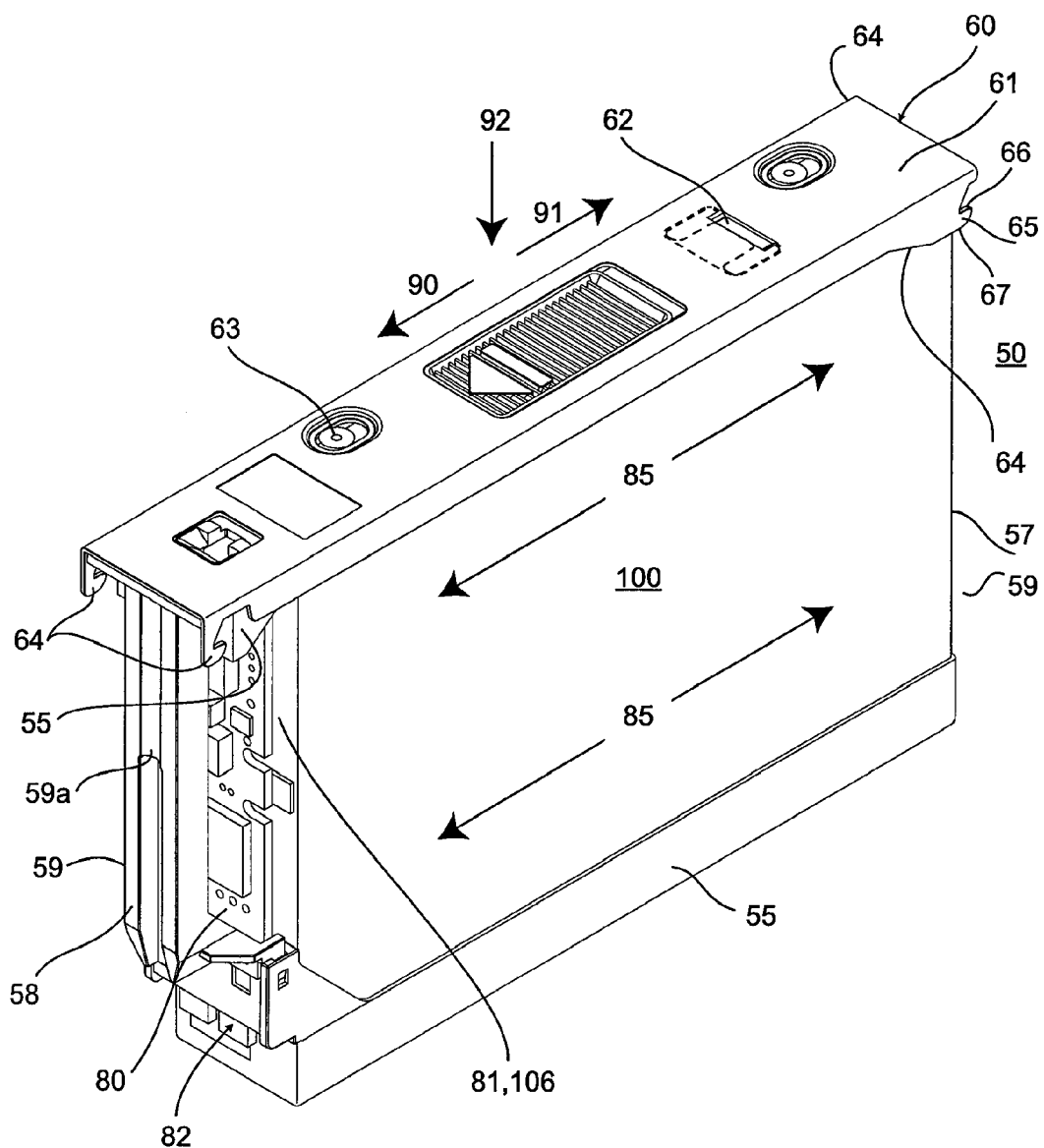
FIG. 4 shows a perspective view of an example of a carrier suitable for use with an embodiment of the present invention.

FIG. 4 shows a carrier 50 attached to a disk drive 100. The carrier 50 comprises a cage-like structure that fits around the disk drive unit 100, holding the disk drive unit 100 therein. The cage comprises a top piece 55 and a bottom piece 56, which run along the sides 103 of the disk drive 100, and a front end piece 57 and a rear end piece 58 at the front and the rear faces 104, 105 of the disk drive 100 respectively, which connect between the top piece 55 and bottom piece 56.

The front and end pieces 57, 58 have shaping 59 to reciprocate with the shaping of the guide members 28 in the bays 22 (shown by FIG. 3) in order to guide the carrier 50 into and out of a received position within the bays 22 when advanced from above. The shaping 59 also includes a downward facing surface 59a for engagement with the ejection system of the bays 22 (described below).

These pieces 55, 56, 57, 58 may be made from for example moulded plastics. Preferably the pieces 55, 56, 57, 58 are relatively thin in order to minimise the amount of space taken up by the carrier 50 and thus maximise the space in the enclosure 10 available for holding disk drive units.

The carrier 50 also has an adaptor board 80. The adaptor board 80 is fixed to the front end piece 57 of the carrier 50 adjacent the rear end 105 of the disk drive unit 100. The adaptor board 80 has a first connector 81 mounted on the board arranged to plug into the disk drive connector 106. The adaptor board 80 has a second connector 82 at the bottom edge of the adaptor board 80 facing downwards with the disk drive 100 oriented as shown in FIG. 4, i.e. with the disk drive on its side 103. Preferably, the second connector 82 is an edge connector. The first connector 81 and the second connector 82 are electrically connected together. Thus, when the carrier 50 is inserted into a bay 22 orientated as shown in FIG. 4 with a downward plugging direction, the second connector 82 mates to the upward facing connector in the bay 22 (not shown) and thus connects the disk drive 100 to the enclosure 10.

The top of the carrier 50 also has a latch assembly 60, comprising a latch member 61 disposed along the top side of the disk drive 100 and slidably attached to the top piece 55 of the cage so as to be slidable a short distance longitudinally along the side 103 of the disk drive 100 (arrows 91,91). The latch member 61 is shown in partial transparency in FIG. 4 to enable the top piece 55 to be seen. The latch member 61 can preferably slide at least about 5 mm. The latch member 61 is preferably thin and made from sheet metal. A spring 62 or other biasing means is provided between the latch member 61 and the top piece 55 of the cage to bias the latch member 61 in a latching direction (arrow 91). The latch member 61 has a ridged portion 63 in its centre which provides grip to the operator to allow the operator to operate the latch 60 (described below). A hook 64 extends downwardly at each corner of the latch member 61 with the end of the hook 64 facing the latching direction 91, i.e. in the same direction as the one in which the latch member 61 is biased by the spring 62. The upper surface of the end of the hook 64 is generally horizontal and provides a lock surface 66. The lower surface of the end of the hook is angled to face downwardly and towards the latch direction 91 and provides a cam surface 67.

Figure 5:
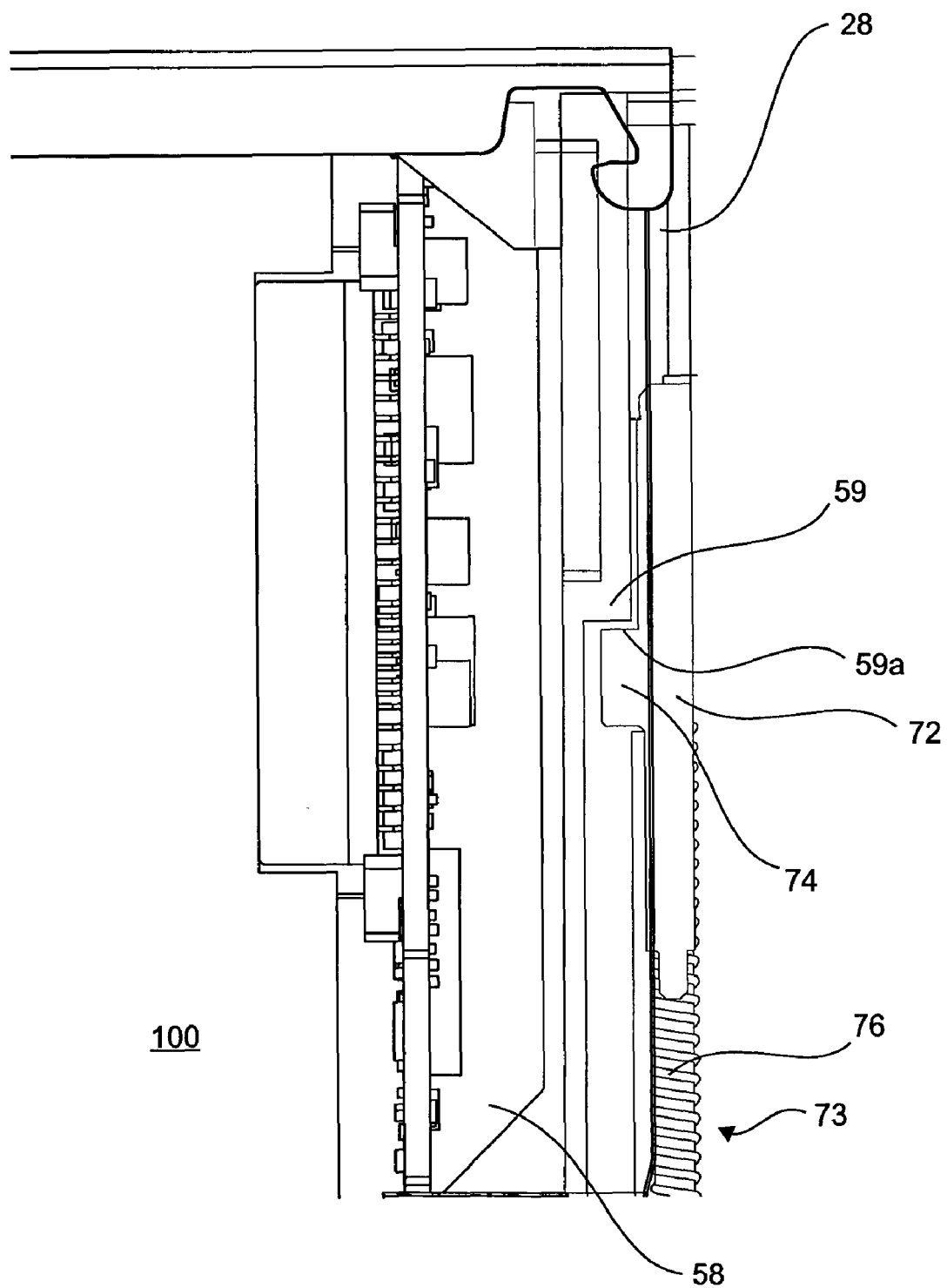
FIG. 5 shows a section view of the carrier of FIG. 4 received in a bay of the enclosure.

Turning back to FIG. 3, the shaping of the guide members 28 has the form of a downwardly extending recessed portion 71 between two downwardly-extending protruding portions 70 in each bay 22. As can be seen from FIG. 3 and the sectional view of FIG. 5, a lift element 72 is disposed in a cavity 73 in each guide member 28. The lift elements 72 can move up and down in the cavities 73. A finger 74 of the lift element extends through a vertical slot 75 in the recessed portion 71 of the guide member 28 so as to extend into the channel between the protruding portions 70. A spring 76, or other biasing means, disposed in the cavity 73 biases the lift element 72 upwards. The lift elements 72 are preferably provided in the guide members 28 at both ends of the bay 22.

When the carrier 50 is inserted into the bay 22, the shaping 59 of the carrier 50 is received in the channel formed between the protruding portions 70 of the guide member 28 such that the carrier 50 is guided into the bay 22 as it is advanced downwards by the operator. Preferably the channel/shaping is different at the two ends of the carrier 50 so that in effect the carrier 50 is keyed to the bay 22, preventing incorrect insertion of the carrier into the bay by the operator. When the carrier 50 is partway inserted into the bay 22, the fingers 74 of the lift elements 72 contact the bearing surfaces 59a in the front and rear pieces 57,58 of the carrier 50, so as to provide a biasing force upwards as the carrier 50 is pushed fully home into the bay 22 by the operator pressing down on the carrier 50. The lift elements 72 in the guide members 28 at the front and rear end of the bays preferably give a 4 kg preload.

Figure 6:
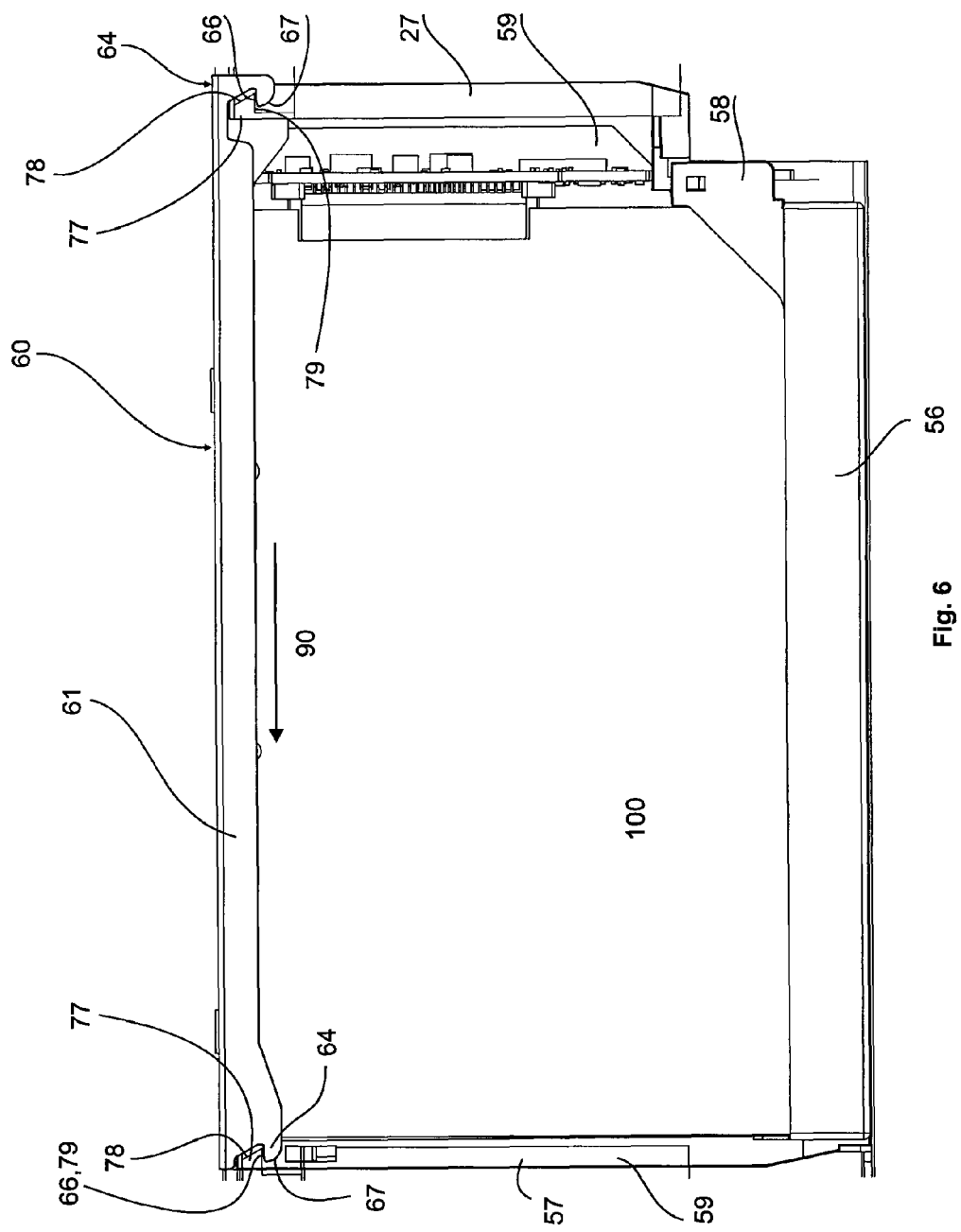
FIG. 6 shows a plan view from the side of the carrier of FIG. 4 in the latched position.
Figure 7:
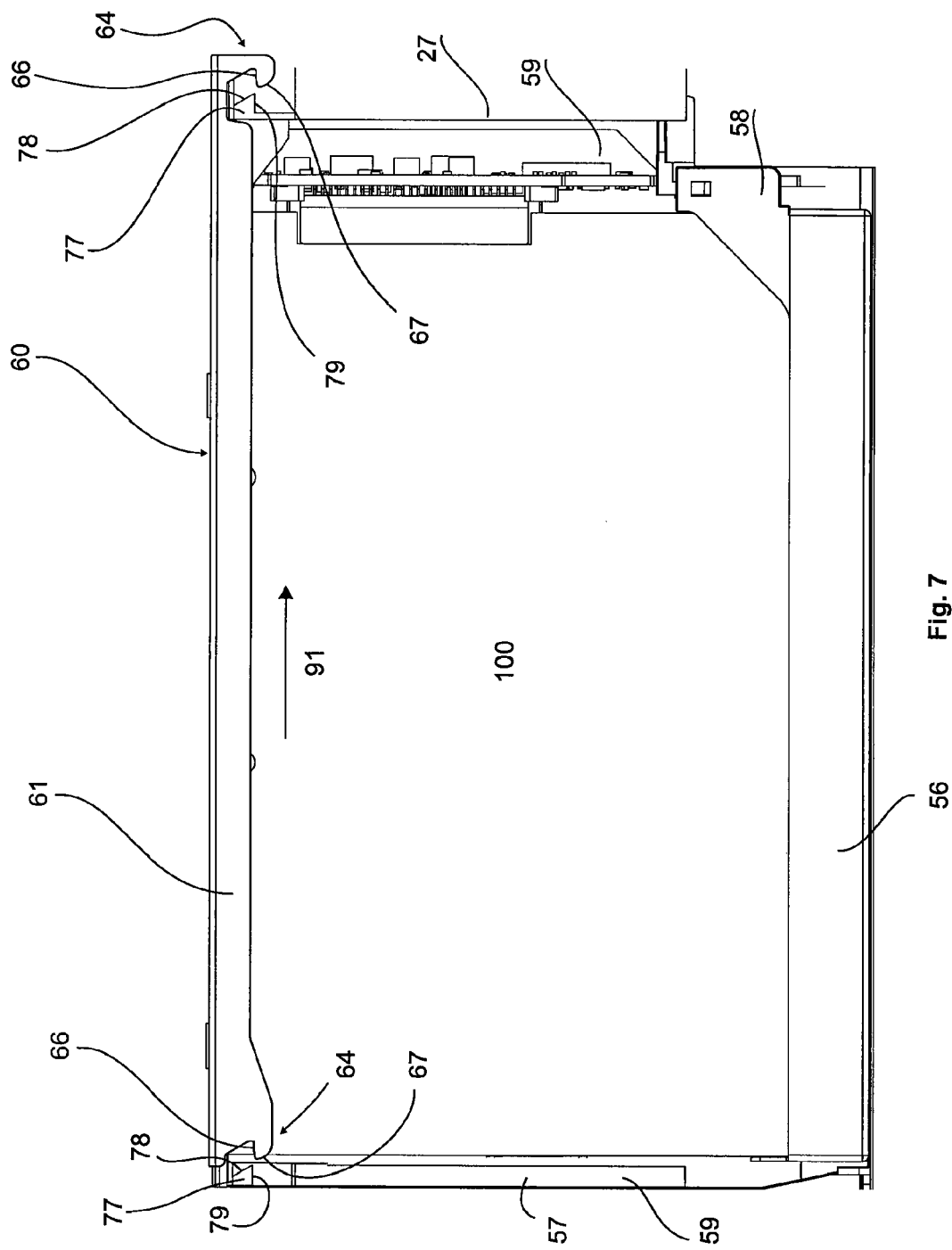
FIG. 7 shows a plan view from the side of the carrier of FIG. 4 in the release position.

As shown in FIGS. 6 and 7, the guide members 28 have hooks 77 for reciprocating and latching with the hooks 64 of the latch 60 of the carrier 50. The hooks 77 each have a camming surface 78 facing in the opposite direction to the camming surface 67 of the carrier hooks 64, and a lock surface 79 facing in the opposite direction to the horizontal lock surface 79 of the carrier hooks 64.

As the carrier 50 is pushed fully home, the camming surfaces 67 of the hooks 64 of the carrier 50 engage and bear against with the camming surfaces 78 of the guide members 28, causing the latch member 61 to move laterally (in the direction shown by arrow 90 in FIG. 4) against the bias of the spring 62 as the carrier 50 is pushed home until the hooks 64,77 clear each other. Once past each other, action of the spring 62 causes the latch member 61 to snap back in the latch direction 91 (shown by FIG. 4) into its locking position, wherein the lock surfaces 66 of the carrier hooks 64 are positioned underneath and facing the lock surfaces 79 of the guide member hooks 77. At this point, the operator can stop applying downward pressure on the carrier 50 and the lock surfaces 66,79 of the hooks 64,77 bearing on each other against the upward bias provided the lift element 72 hold the carrier 50 securely in place in the bay 22. This locking position is shown in FIG. 6.

If desired, a visual indicator can be provided to show the operator that the latch 60 has successfully engaged in the locked position, for example by providing a red portion somewhere on the top piece 55 which is visible when the latch 60 is in the unlocked position, but hidden by the latch member 61 when the latch 60 is in the locked position.

To remove a carrier 50 from a bay 22, the latch 60 is released by the operator sliding the latch member 61 in the release direction 90 by applying a force to the ridged portion 63 on top of the latch 60 until the hooks 64,77 are clear of each other, as shown in FIG. 7. As the operator releases the downward pressure, the lift elements 72 lift up the carrier 50 partway out of the bay 22 so as to be slightly proud of other carriers 50, allowing the sides of the carrier 50 to be gripped by the operator and thereby aiding simple removal of the carrier 50 from the enclosure 10.

Thus a way of securing a disk drive 100 in a storage enclosure 10 is provided. Four latch points are provided with camming surfaces to ensure that the carrier 50 self-latches when it is pushed into the bay 22. The arrangement of the latch member 61 ensures each corner of the carrier 50 is latched simultaneously.

The latch is also simple for the operator to manipulate. Once the carrier 50 is inserted into the entrance of the bay 22, the operator simply pushes down the carrier 50 by applying downward pressure to the ridged portion 63 until the carrier 50 latches in place. To remove the carrier 50, the operator simply pushes the latch member 61 to the release position by applying lateral pressure to the ridged portion 63 until the latch 60 disengages and the lift elements 72 lift the carrier 50 part way out of the bay 22, and then grasps the carrier 50 at its sides and lifts the carrier 50 to complete the removal of the carrier 50.

The preferred latch 60 has the advantage of taking very little space. In particular, the latch member 61 and top piece 55 of the carrier 50 can be arranged in a 2.2 mm high envelope in a preferred embodiment. The lateral movement of the latch member 61 between the locked and released positions is preferably more than 1 mm and less than 10 mm, and more preferably more than 2 mm and less than 5 mm, which is adequate to allow engagement and disengagement of the hooks 64,73, whilst taking up little lateral space. This is highly beneficial, since this allows disk drive units 100 to be packed more tightly in the enclosure 10, allowing more to be provided in an enclosure 10 of a given size.

Furthermore, the latch member 61 and bottom piece 56 of the carrier 50 extend around the sides of the disk drive 100 and slightly wrap around onto the top and bottom faces 101,102 of the disk drive 100 creating a channel 85 between the top and the bottom faces 101, 102 adjacent disk drive units 100 in the drawer 20 bounded by the latch member 61 and bottom piece 56 of the carrier 50. These channels 85 are aligned with the apertures 26 in the cross members 24 allowing cooling air to be drawn through the drawers 20 to cool the various disk drives 100 therein. Thus the latch 60 not only does not interfere with providing air flow to the disk drives 100, but in fact contributes to forming an airflow channel to the disk drives 100, allowing better cooling.

The carrier 50 has a single touch point to both insert and remove the disk drive from the enclosure 10, which is ridged portion 63 to enable the operator to gain traction when moving it, which provides simple operation for the operator.

Other arrangements are possible. For example, lift elements 72 can be provided at either end or both ends of the disk drive 100, or indeed other biasing means can be provided underneath the disk drive 100. The lift elements 72 can be provided by the carriers 50 rather than the guide members 28 of the bays 22. The latch assembly 60 may have hooks for engaging with the bays 22 at different positions. Other orientations of disk drive 100 in the carrier 50 and other plugging directions are possible.

Figure 8:
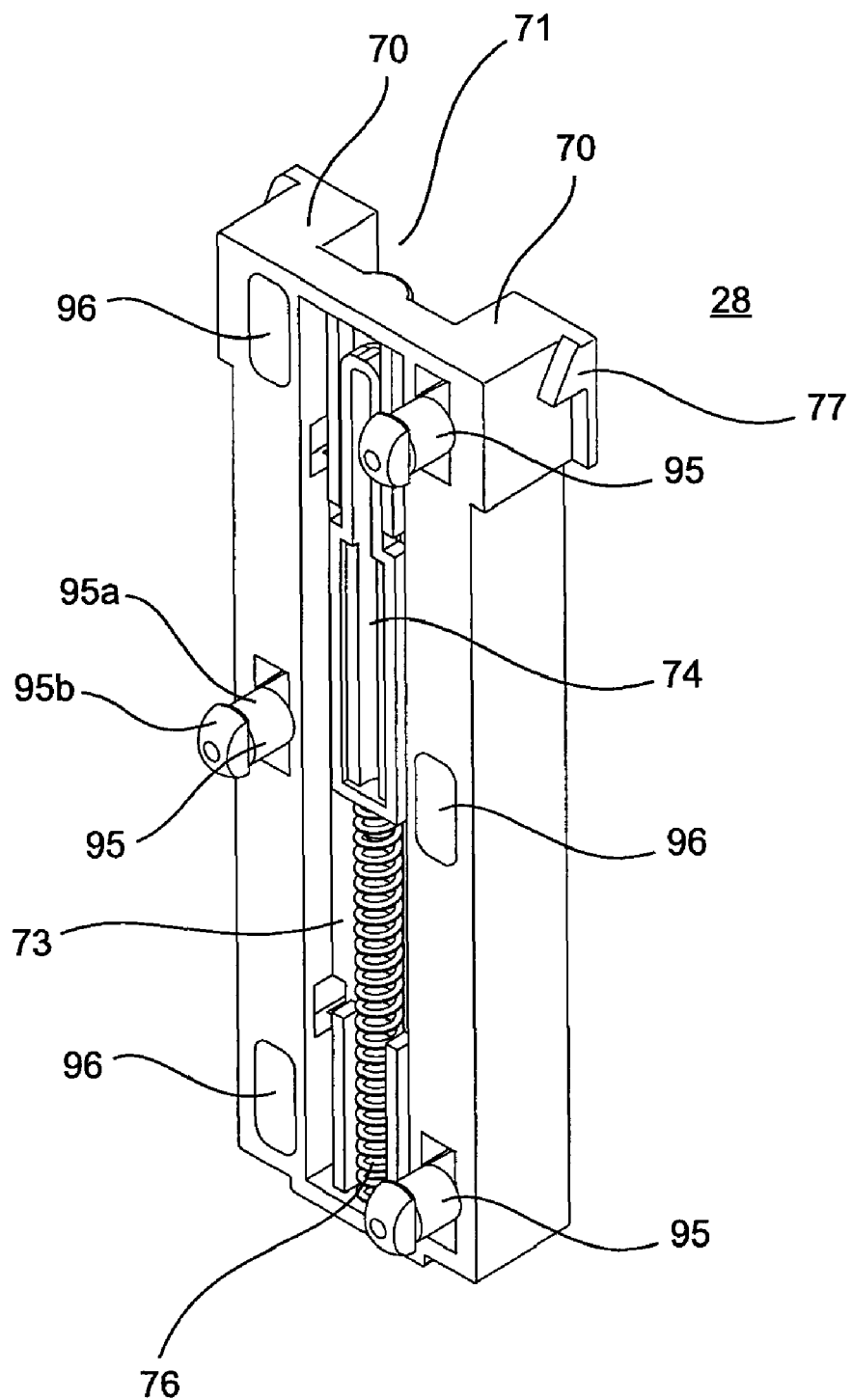
FIG. 8 shows a detailed view of an example of a guide member according to an embodiment of the present invention.
Figure 9:
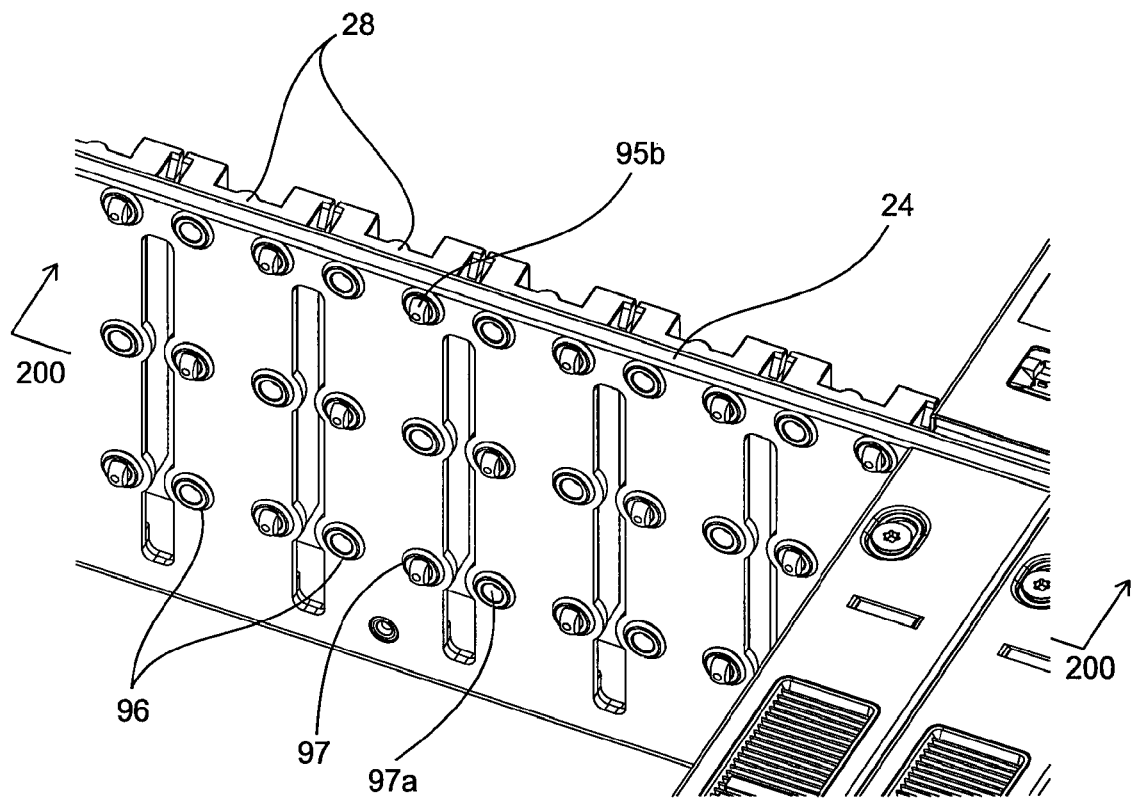
FIG. 9 shows a detailed view of the guide member of FIG. 8 attached the drawer of the storage enclosure; and, FIG. 10 shows a horizontal sectional view through the guide members of FIG. 8 attached to a cross member.

FIGS. 8 and 9 show in detail how the guide members 28 are attached to the cross members 24. FIG. 8 shows the rear of a guide member 28, i.e. showing foremost the face that abuts the cross member 24 when attached to the cross member 24. The lift element 72 and spring 76 in its cavity 73 can be seen. Projecting from the rear of the guide member 28 are a plurality of lugs 95, three in this example, each comprising a shaft portion 95a and a head portion 95b. Preferably, there are at least three lugs 96, though different numbers of lugs 96 are possible. However many lugs 95 are present, the lugs 95 are preferably staggered relative to each other so as to be not all co-linear. In this example, the lugs 95 are disposed at different heights on the guide member 28 and have at least two lateral positions relative to the vertical axis of the guide member 28. A plurality of holes 96 is provided on the guide member 28. The position of the holes 96 are a mirror image of the position of the lugs 95.

FIG. 9 shows a cross member 24 with guide members 28 attached to its far side (guide members 28 not shown on the foremost side for clarity). The cross member 24 has a plurality of holes 96. In this example, there are two vertical columns of three holes 96 for each guide member. Each hole has a mount 97 attached thereto. The mounts 97 are compliant and may be made of any suitable material, for example an elastomer or another material capable of damping vibrations. The mounts 97 may be overmoulded to the holes 96. The mount 97 has the general form of a bush, or grommet, or eyelet surrounding the hole, i.e. the mount 97 comprises a thin, generally circular portion lying against both the front and rear surfaces of the cross member 24 connected by a portion extending through the hole 96, the mount 97 having a hole 97a therethrough. The positions of the holes 97a correspond to the positions of the lugs 95 and holes 96 of the guide member 28.

The guide member 28 can be attached to the cross member 28 by pushing the lugs 95 through the holes 97a in the mounts 97. The head portion 95b is larger than the hole 97a in the mount 97 but can pass through the hole 97a due to the compliant material used for the mount 97. When the head portion 95b has been forced through the hole 97a, it prevents the guide member 28 from detaching from the cross member 28 during normal operation of the enclosure 10. The guide member 28 can be removed by the operator pulling the guide member 28 clear by supplying a sufficient force to make the head portions 95b pass back through the holes 97a. Thus, the guide member 28 is securely held in position and the only contact between the guide member 28 and the cross member 24 is via the mounts 97. This allows the mount 97 to provide isolation and/or vibration damping between the disk drive 100 and the supporting structure of the enclosure.

Figure 10:
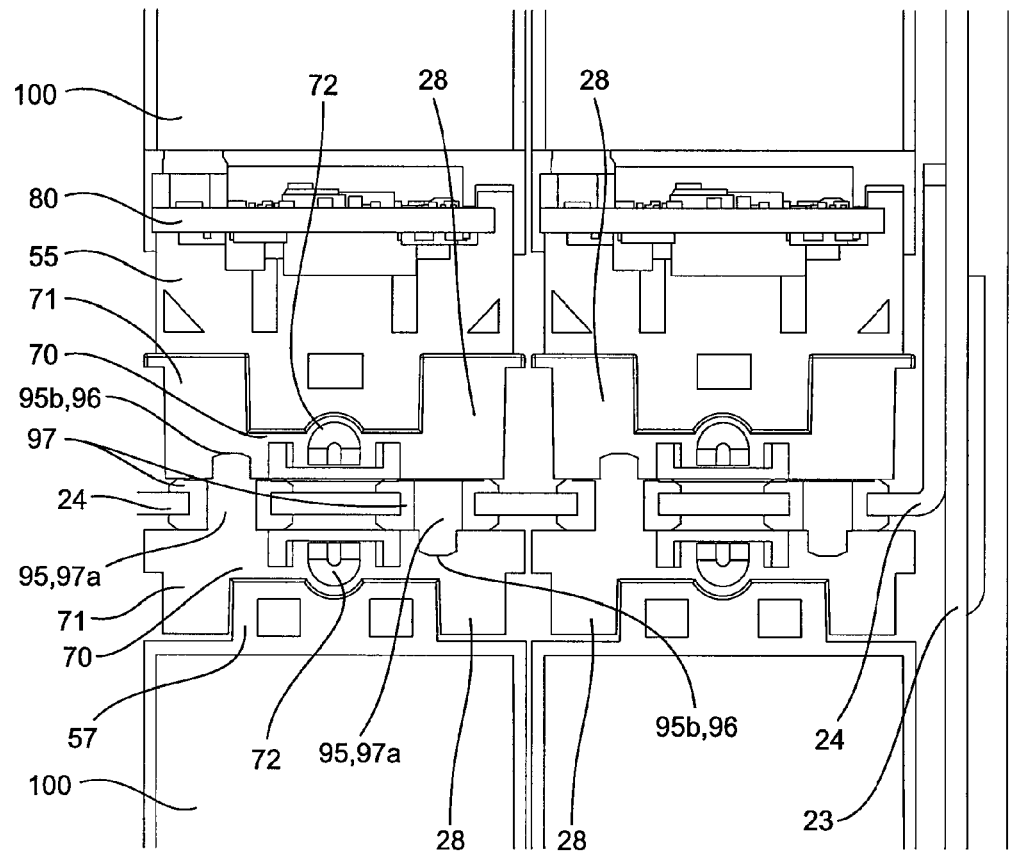

As will be appreciated, the remaining empty holes 97a shown in FIG. 9 are used to attach guide members 28 on the front face of the cross member 24 ("front-facing guide members" herein forth) for use with the row of bays 22 in front. FIG. 10 shows a horizontal cross sectional view taken through line 200 (shown in FIG. 9) through the cross member 24 with both front- and rear-facing guide members 28 attached. The front-facing guide members 28 also have shaping 70,71 and lift elements 72 similar to the rear-facing guide member 28 shown in FIG. 8. Thus, when inserted into their bays 22, the carriers 50 are constrained by guide members 28 at both ends of the bay 22.

The combination of compliant mount 97 and rigid location array provided by the guide members 28 ensure spatial location within the chassis array whilst providing a "soft" mount. This allows the disk drives 100 in their carrier 50 to be isolated from their surrounding structure thus attenuating external vibrations entering the disk drive and affecting its servo performance and damping the disk drive concerned to help reduce vibration produced by that disk drive being transmitted to the rest of the system. This arrangement "floats" the guide members 28 in the drawer 20 on mounts in such a way that each axis (x, y & z and any combination thereof) is isolated from the rigid chassis 23,24 of the drawer 20 whilst still maintaining dimensional accuracy within the disk drive array.

Other arrangements are possible. For example, instead of the mounts 97 being individual bushes attached around the holes in the cross member 24, the mounts can be provided by a sheet of resilient material (not shown) attached to the cross member 24 having holes corresponding to the holes 96 in the cross member 24. The sheet of resilient material can for example be bonded to the cross member 24. A sheet of resilient material would preferably be provided for each side of the cross member 24 (assuming guide members 28 were being mounted to both sides of the cross member 24). The guide member 28 would then attach as before, with the lugs 95 being pushed through the holes in the sheet of resilient material and cross member 24. Alternatively, this example can dispense with the arrangement of lugs of the guide member 28 being received in holes in the mounts 97/cross member 24. Instead, the resilient mounts can bonded between the cross member 24 and the guide member 28. In both cases, a sheet of resilient material can be provided for each guide member 28, or a single sheet can be provided for the whole of the cross member 24, i.e. for multiple guide members 28.

Embodiments of the present invention have been described with particular reference to the example illustrated. However, it will be appreciated that variations and modifications may be made to the examples described within the scope of the present invention.

The invention claimed is:

1. A storage enclosure comprising a plurality of bays for receiving disk drives, the storage enclosure comprising:
    a chassis;
    a plurality of guide members, each bay having a first guide member at one end of the bay and a second guide member at the opposed end of the bay, the guide members being constructed and arranged to engage with and guide a disk drive into the bay and to hold the disk drive in a received position in the bay; and,
    a plurality of resilient mounts by which each guide member is attached to the chassis, wherein the mount is arranged to isolate the disk drive from the chassis to reduce vibration being transmitted between the disk drive and the chassis.

2. A storage enclosure according to claim 1, wherein the guide member has a plurality of projections and each mount has a hole therethrough, wherein the projections are received in the holes of the mounts in order to attach the guide member to the chassis.

3. A storage enclosure according to claim 2, wherein the projection has a head portion that is larger than the hole in the mount, the mount being compliant to allow the head portion to pass through the hole to secure the guide member in place.

4. A storage enclosure according to claim 3, wherein the mounts comprise bushes attached to holes in the chassis.

5. A storage enclosure according to claim 3, wherein the mounts comprise a sheet of resilient material attached to the chassis, the chassis having holes corresponding to the holes in the mounts.

6. A storage enclosure according to claim 3, wherein the chassis comprises at least one sheet member, wherein the sheet member has guide members attached to both of its sides for corresponding bays on either side of the sheet member.

7. A storage enclosure according to claim 6, wherein the guide members have holes or depressions therein for receiving the head portions of the projections of the corresponding guide members on the other side of the sheet member.

8. A storage enclosure according to claim 1, wherein the projections of each guide member are staggered relative to each other.

9. A storage enclosure according to claim 1, wherein at least one guide member comprises a resiliently biased lift element arranged to lift the disk drive at least partially out of the bay.

10. In combination, a storage enclosure according to claim 1 and a disk drive held in a carrier, wherein the carrier is received in the bay and held in position by a guide member at each end of the bay.

11. A method of receiving a disk drive in one of a plurality of bays in a storage enclosure, the method comprising:
   advancing the disk drive into the bay; and,
   guiding the disk drive into a received position in the bay with a guide member at each end of the bay,
   wherein the storage enclosure has a chassis and each guide member is attached to the chassis by a plurality of resilient mounts arranged to isolate the disk drive from the chassis to reduce vibration being transmitted between them.

12. A method of manufacturing a storage enclosure having a plurality of bay for, receiving disk drives, the enclosure having a chassis and a plurality of guide members, the bays having a guide member at each end for guiding a disk drive into a received position in the bays, the method comprising:
   attaching a plurality of resilient mounts to the chassis; and,
   attaching the guide members to the chassis by pushing a plurality of protrusions of each guide member through corresponding holes in the mounts.

* * * * *